United States Patent [19]

Meszko et al.

[11] Patent Number: 4,654,885
[45] Date of Patent: Mar. 31, 1987

[54] MOBILE RADIO RANGE EXTENDER WITH SAW FILTER

[75] Inventors: William R. Meszko, Fort Worth; Gary Chemelewski, N. Richland Hills, both of Tex.

[73] Assignee: Motorola, Inc., Schaumburg, Ill.

[21] Appl. No.: 745,480

[22] Filed: Jun. 17, 1985

[51] Int. Cl.$^4$ .............................................. H04B 1/10
[52] U.S. Cl. .................................. 455/219; 455/223; 455/315; 455/307
[58] Field of Search ............... 455/194, 200, 219, 220, 455/222, 223, 224, 225, 307, 311, 315, 338; 328/165

[56] References Cited

U.S. PATENT DOCUMENTS

| | | | |
|---|---|---|---|
| 3,191,124 | 6/1965 | Brown | 455/224 |
| 3,304,503 | 2/1967 | Walker, Jr. | |
| 3,339,144 | 8/1967 | Squires | |
| 3,366,884 | 1/1968 | Kurusu | |
| 3,699,457 | 10/1982 | Wright | |
| 3,725,674 | 4/1973 | Schaeffer et al. | 307/237 |
| 4,314,377 | 2/1982 | Kondo et al. | 455/223 |
| 4,334,317 | 6/1982 | Beesley | 455/194 |
| 4,510,624 | 4/1985 | Thompson et al. | 455/223 |
| 4,525,867 | 6/1985 | Shiratani | 455/194 |
| 5,521,917 | 5/1985 | Holt | 455/223 |

OTHER PUBLICATIONS

Case History of a Surface-Wave TV IF Filter for Color Television Receivers, Devries et al., Proceedings of the IEEE, vol. 64, No. 5, May 1976, pp. 671-676.

Primary Examiner—Ng: Jin F.
Attorney, Agent, or Firm—Thomas G. Berry; Donald B. Southard

[57] ABSTRACT

A mobile radio receiver employs an SAW filter to provide an appropriate time delay to enable an extender to effectively blank the recovered signal thereby preventing noise from entering the IF section of the radio. The SAW filter allows long signal delays without significant pulse stretching while also allowing narrow IF bandwidths. The control pulse to the blanker switch is shaped to reduce the coupling of noise generated within the blanker switch from the received signal path. The operation of the extender is controlled by the main receiver through an AGC signal to determine when, and to what extent, the extender is enabled.

15 Claims, 4 Drawing Figures

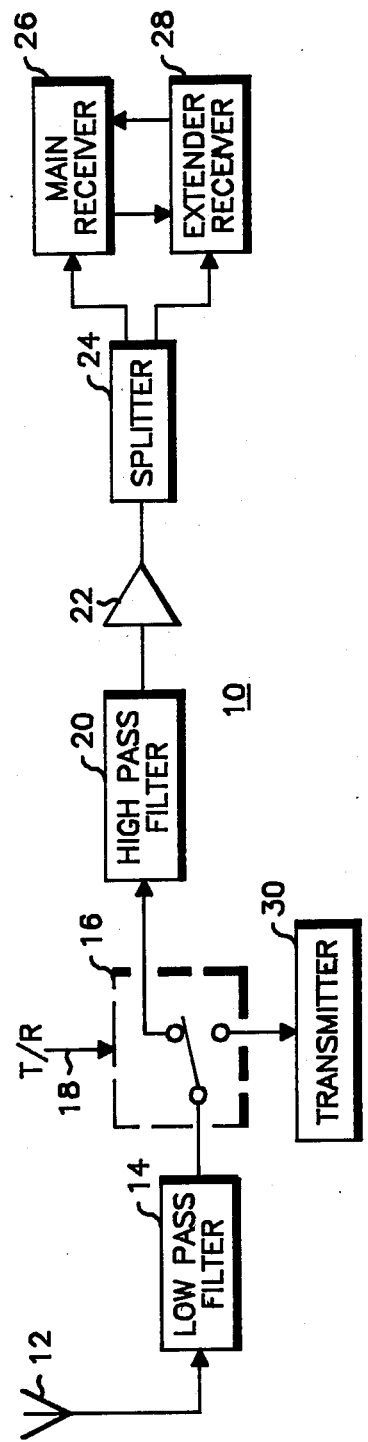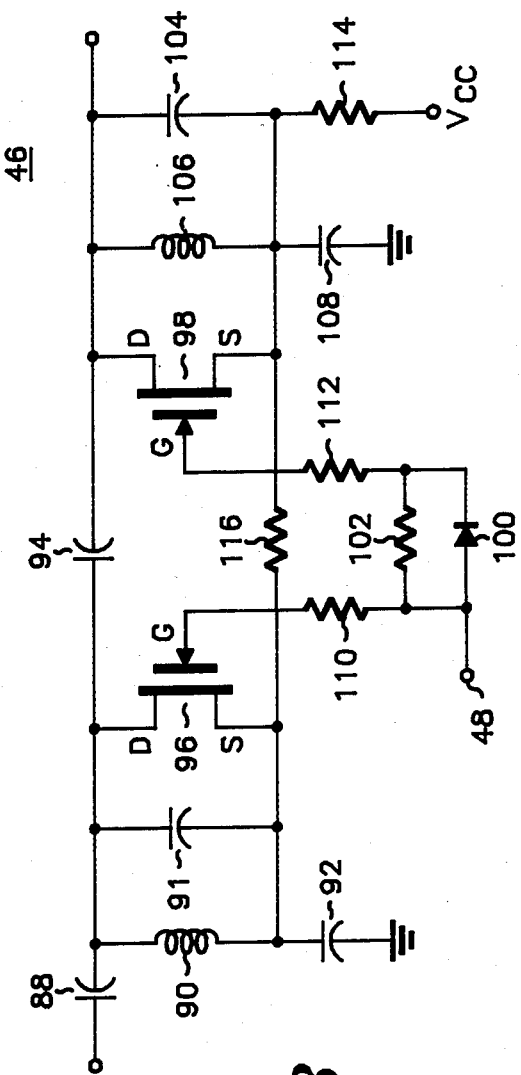

MOBILE RADIO RANGE EXTENDER WITH SAW FILTER

This invention relates generally to mobile radios and more particularly to those mobile radios that employ range extenders.

Those skilled in the art will appreciate the harsh operating environment of a mobile radio. Aside from the constant vibration and temperature extremes, a mobile radio must operate effectively in a severely noisy environment. The major contributors to this noise environment include engine noise (both from the vehicle using the mobile radio and surrounding vehicles), electrical interference from high power lines, and atmospheric disturbances.

Some mobile radios have employed range extenders to suppress or eliminate these noise effects. Of course, the basic purpose of an Extender, that is, to detect the presence of impulse-type noise and momentarily prevent the noise and the recovered signal from reaching the IF, is well known. Clearly, for the Extender to function properly it must detect the presence of noise and inhibit the signal path in the main receiver before the noise gets to the point where it is to be stopped. Historically, implementation of an Extender in a mobile receiver was facilitated by the commensurate bandwidth of the main receiver and the Extender (i.e., each about one MHz). Thus, the "race" condition was not a significant problem because, since the bandwidths were practically the same, the delay was effectively the same or could be compensated for by small "lumped element" filters.

Modern mobile radios however, have extremely broad bandwidths. Since most mobile radios have frequency synthesizers that can generate a wide variety of frequencies, mobile radios today use broad bandwidth filters permitting the mobile radio user to operate over a wide band of frequencies. Thus, it is common for a receiver to have a bandwidth of 20 or 30 MHz. However, this bandwidth extension creates significant problems in the operation of the Extender circuitry. Since the bandwidth of the main receiver may be 20 times the bandwidth of the Extender (thus making the extender delay 20 times that of the main receiver), control pulses cannot reach the blanker switch in time to prevent the noise from entering the receiver IF. A "lumped element" filter cannot be used to compensate for a delay of this magnitude since the current trend is towards radio size minimization, and the the size of such a filter would be prohibitive. Alternately, the bandwidth of the Extender cannot be extended to be comparable to the bandwidth of the main receiver since other carriers or strong information signals may be interpreted as noise and would "blank" the receiver. Overall, the effect of such an Extender bandwidth extension would be that the main receiver would be inhibited most of the time. Thus, a need exists to provide effective noise blanking while contemporaneously providing broad receiver bandwidth and radio size reduction.

SUMMARY OF THE INVENTION

Accordingly, it is an object of the present invention to provide a mobile radio Extender which alleviates the aforedescribed problems.

It is a more particular object of the present invention to provide a mobile radio Extender using a surface acoustic wave (SAW) filter to afford both selectivity and time delay in an appropriately sized filter.

Accordingly, these and other objects are achieved in the present mobile radio Extender with SAW filter.

In practicing the invention, the received signal is divided into two signals; one each applied to the main receiver and the other to the Extender. To compensate for the wide disparity in bandwidth, and thus time delay, the main receiver employs a surface acoustic wave (SAW) filter to provide sufficient time delay to allow the Extender to detect and inhibit the noise information from entering the IF by controlling a "blanker" switch which effectively suppresses or eliminates the signal. The Extender (which determines when to activate the blanker switches), is controlled by an automatic gain control (AGC) signal that is commonly generated in mobile receivers. Accordingly, in strong signal areas the need for the Extender is slight. Conversely, in weak signal areas, or high ambient noise areas, the need for the Extender is correspondingly increased. Therefore, the AGC signal provides an readily available measure to determine when, and to what extent, the Extender operation is required. Thus, the present invention solves the problem experienced in prior art mobile receivers thereby allowing a wide main receiver bandwidth and a narrow Extender bandwidth while effectively blanking noise from entering the IF.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the accompanying drawings, and the several figures of which like reference numerals identify like elements, and in which:

FIG. 1 is a block diagram of a mobile radio employing the Extender of the present invention;

FIG. 3 is a schematic diagram of the blanker switches of FIG. 2;

DETAILED DESCRIPTION OF THE PREFERRED EMBODIMENT

Figure 2:
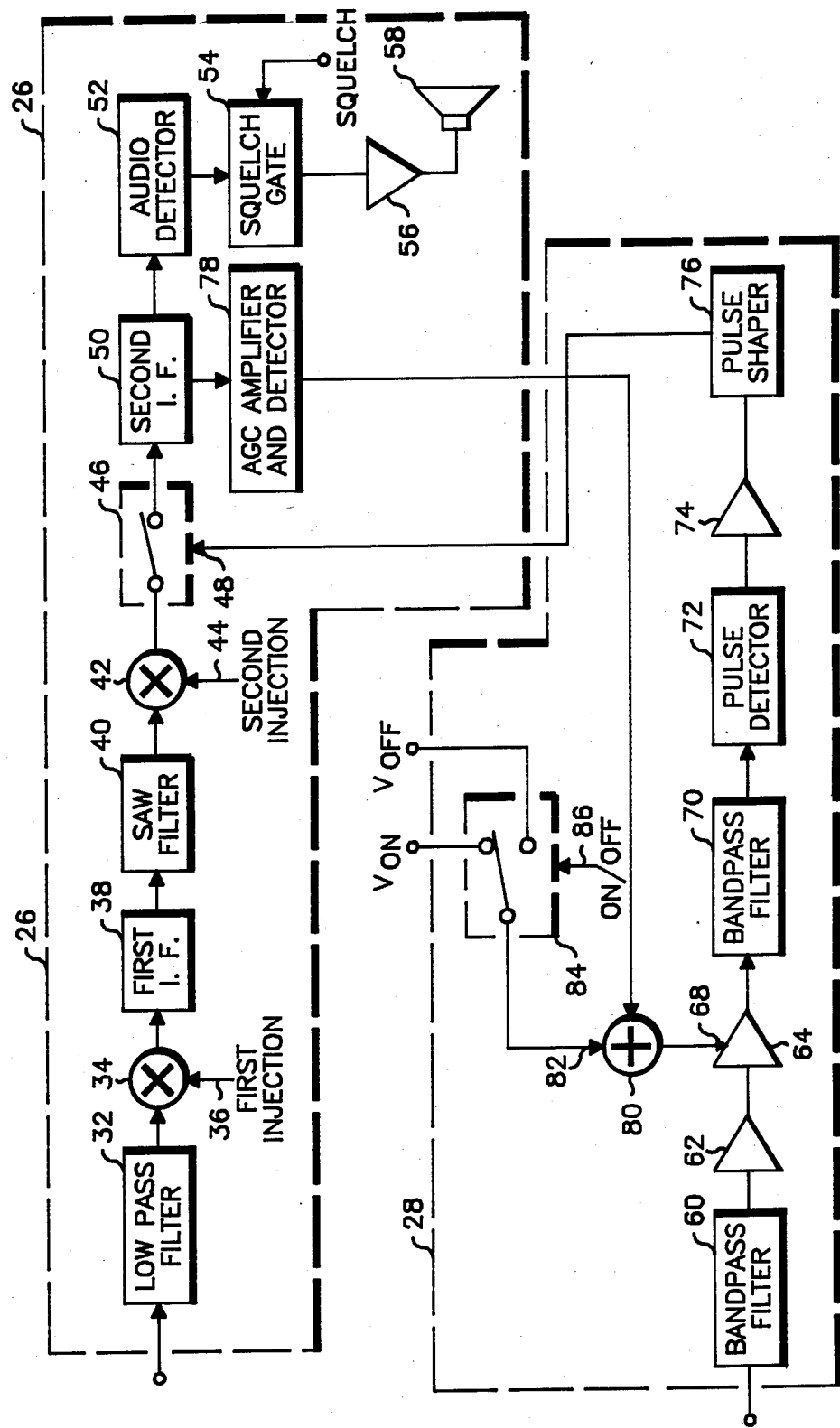
FIG. 2 is a expanded block diagram of the main receiver and Extender receiver of FIG. 1.

A mobile radio employing the Extender of the present invention is shown in block diagram form in FIG. 1. When receiving, the antenna 12 directs the received signal to the low pass filter 14 which provides an effective upper band-limit cutoff. The low pass filter 14 can be constructed using any suitable topology and may, for example, be an elliptic filter with an upper frequency corner of 55 MHz. The band-limited signal is next applied to a switch 16 which, when receiving, is coupled to the high pass filter 20. The switch 16 is controlled via an input 18 which is generally a logic signal generated by combinational logic gates, a microprocessor or other suitable equivalent. The high pass filter 20 can also be constructed using any suitable topology and may, for example, be an elliptic filter with a lower frequency cut-off of 30 MHz. The low pass filter 14 and the high pass filter 20 provide a band-limited signal to the amplifier 22. For example, if the low pass filter 14 had a frequency cutoff of 55 MHz and the high pass filter 20 had a frequency cutoff of 30 MHz, an effective band-limited signal extending from 30 MHz to 55 MHz (i.e. 25 MHz wide) would be presented to the amplifier 22. The amplifier 22 amplifies the received signal and applies it to the splitter 24.

The purpose of the splitter 24 is to divide the received signal into two signals—one provided to the main receiver 26 and the other to the Extender 28. The splitter 24 may be embodied in many different forms. For example, it may be a resistive splitter providing a predetermined amount of power to each receiver. Alternately, it could be an inductive splitter to divide the power by selected coil-turn-ratios as is well known in the art. Further, it is possible to use capacitive taps to "sniff" the appropriate signal power and apply it to the receivers. Generally, any device that divides the received signal into two appropriate signals while maintaining an impedance match for the main receiver 26 and the Extender 28 will be appropriate.

Many receiver designs place a "pad" or attenuator at the input to the main receiver 26 and the Extender 28. This provides protection from external impedance changes affecting the internal operation of the receivers. Thus, if the main receiver 26 and the Extender 28 are appropriately isolated from the amplifier 22, the splitter means 24 may be embodied as a hard-wire connection or printed foils on a printed circuit (PC) board.

To transmit information, the switch 16 would couple the low pass filter 14 to the transmitter 30. The signal transmitted by the transmitter 30 would be filtered by the low pass filter 14 which would prevent transmitter harmonics from corrupting the transmitted spectrum. Of course, the filtering arrangement of FIG. 1 could also be effectively accomplished by using a bandpass filter in place of the low pass filter 14 and the high pass filter 20. Further, for the case of a receive only radio, the transmitter 30 and the switch 16 could be omitted entirely without impeding the performance of the present invention.

Referring now to FIG. 2, the operation of the main receiver 26 and the Extender receiver 28 may be described in detail. The main receiver 26 accepts the signal presented from the splitter 24 (see FIG. 1) at the lowpass filter 32. The lowpass filter 32 is used to provide further selectivity from any harmonics or signal impurities that may be injected by the amplifier 22 (see FIG. 1). The lowpass filter 32 may be implemented using any acceptable topology and may be, for example, substantially similar to the lowpass filter 14 of FIG. 1. After filtering, the received signal is applied to the mixer 34 which accepts as a second input a first injection signal 36 which may be derived from a channel element, a frequency synthesizer, or other suitable equivalent. The filtered signal and the first injection signal mix in the mixer 34 as is well known in the art and form a first intermediate frequency (IF) signal which may be, for example, 75.7 MHz. The IF signal formed by the mixer 34 is next processed by the first IF section 38 which may include amplifiers, filters, and attenuators.

After processing the first IF section 38, the signal is next sent to the surface acoustic wave (SAW) filter 40. The SAW filter 40 time delays the IF signal for approximately three microseconds., Thus, the SAW filter 40 provides the major amount of time delay in the main receiver 26 since the delay provided by the lowpass filter 32 (and any filtering that may be present in the first IF section 38) is generally measured in nanoseconds and thus is negligible compared to the delay provided by the SAW filter 40. Generally, the only requirements on the SAW filter 40 is that it has an appropriately low insertion loss, for example 5.5 dB, to prevent over attenuation of the first IF signal, and an appropriately low triple transit response. Those skilled in the art will appreciate that since the triple transit response is a signal delayed in time by a factor three (compared to the main signal), it will also need to be "blanked" if it is not sufficiently attenuated. Accordingly, a triple transit response of approximately $-25$ dB (or less) is required. Of course, the SAW filter 40 must appropriately delay (approximately 3 microseconds) the first IF signal. The exact filter topology of the SAW filter 40 is not critical, however, a bandpass filter topology having a bandwidth on the order of 1 MHz is preferred since the SAW filter 40 may then provide frequency selectivity in addition to time delay in an appropriately sized package.

The delayed IF signal is then applied to the second mixer 42 which accepts as a second input a second injection source at input 44 which may be derived from a channel element, frequency synthesizer or other suitable means. Further, the second injection source may be derived by multiplying the reference oscillator of the first injection source. The second injection signal and the time delayed IF signal are mixed in mixer 42 and the output signal applied to the blanker switch 46.

The blanker switch 46 provides the means by which the received signal is interrupted an thus prevented from entering the second IF section 50. The blanker switch 46 may be implemented using any suitable technology and may be, for example, one or more field effect transistors (FET's) configured either in series or in shunt (to the receive signal path) to provide the required attenuation. Further, the blanker switch 46 may be positioned anywhere between the SAW filter 40 and the main selectivity (generally crystal filters) of the second IF section 50. In particular, the blanker switch 46 may be positioned immediately following the SAW filter 40, or the main receiver 26 may "blank" both before and after the second mixer 42. In the preferred embodiment, the blanker switch 46 is positioned after the second mixer, and is implemented using two shunt FET switches which provide an appropriate amount of attenuation while contemporaneously consuming little PC board area.

Normally, the blanker switch 46 couples the output of the mixer 42 to the input of the second IF section 50 to allow the received signal to be processed by the audio detector 52 and subsequent circuitry. However, when the Extender determines that a noise condition exists, the blanker switch 46 is momentarily "opened" (by asserting the control input 48) to prevent the received signal from entering the second IF 50 and being detected by the audio detector 52. The "open" duration is appropriately set to prevent the recovered signal containing the noise from entering the second IF 50, after which the blanker switch 46 "closes" permitting normal operation.

The second IF section 50 typically includes a crystal filter section which provides the major portion of the selectivity of the main receiver 26. After filtering (and any amplification) in the second IF section 50, the recovered signal is coupled to the audio detector 52 which recovers the transmitted audio signal using any appropriate technique as is well known in the art. The recovered audio signal is next applied to the squelch gate 54 whose purpose is to allow only a proper audio signal to reach the speaker in the well known squelch operation. Thus, when receiving a signal, the squelch gate 54 will pass the recovered audio to the audio power amplifier 56 which provides sufficient amplification to drive the speaker 58 allowing the operator of the mobile radio to hear the transmitted information.

The Extender 28 accepts the second signal provided by the splitter 24 (see FIG. 1) at bandpass filter 60. The bandpass filter 60 (which may include an attenuator to provide isolation from the main receiver 26) sets the bandwidth of the Extender 28 and determines the amount of the frequency spectrum that the extender 28 will monitor for noise. Since the bandwidth of the main receiver 26 is so broad (in this example 25 MHz) there may be several mobile radio users transmitting in the allotted spectrum. Thus the bandpass filter 60 of the Extender 28 must be set to monitor a portion of the frequency band that is not being used by other carriers or information signals since they may be interpreted as noise and the main receiver 26 would be inhibited. Accordingly, the bandpass filter 60 is generally tuneable anywhere across the band of operation (in this example 30 to 55 MHz) and defines the operating bandwidth of the Extender 28. The bandpass filter 60 may be implemented by any topology that facilitates tuning and may be, for example, a 3 pole coupled resonator filter having a 1 MHz or suitable equivalent.

The band-limited noise signal is then applied to matching amplifier 62 which provides an impedance match to the bandpass filter 60 while contemporaneously providing an appropriate amount of gain to the received signal. The now amplified signal is applied to a second amplifier 64 which accepts an automatic gain control (AGC) input signal at terminal 68. The AGC signal applied at port 68 of the amplifier 64 increases or decreases the gain of the amplifier 64 in the well known AGC operation. The RF amplifier 64 may be implemented using any suitable design and may be, for example an MC1590 manufactured by Motorola, Inc.

The now appropriately amplified noise signal is applied to bandpass filter 70 to again band-limit the signal which is then coupled to pulse detector 72. The pulse detector 72 monitors the amplified band-limited signal and compares it to a predetermined threshold to determine when noise spikes (or pulses) are present. When the noise peaks exceeds the predetermined threshold the pulse detector 72 outputs a pulse indicating that excessive noise is present. The pulse output from the pulse detector 72 is amplified in pulse amplifier 74 which provides sufficient gain to the pulse to "trigger" the pulse shaper 76.

The pulse shaper 76 accepts the amplified "trigger" pulse and first generates a substantially rectangular pulse which is then shaped into a substantially trapezoidal shape having sloped rising and falling edges and having a predetermined pulse duration. The duration of the pulse generated by the pulse shaper 76 is set to allow sufficient time for the blanker switch 46 to reach and maintain maximum attenuation thus preventing the noise signal being delayed by the SAW filter 40 from entering the second IF 50. For example, the delay in the main receiver 26 (which is due primarily to the SAW filter 40) may be 3 microseconds. Due to the approximately 1 MHz bandwidth of the bandpass filter 60, and subsequent detection and pulse shaping times, the delay through the Extender 28 may be approximately 500 nanoseconds. Therefore, the blanker switch pulse could arrive at the blanker switch 46 approximately 2.5 microseconds ahead of the noise signal. However, the blanker switch 46 requires some time after the assertion of the blanker switch pulse to reach full attenuation. Accordingly, part of this excess delay time is used in achieving this purpose. Further, in mass production, the exact delay in the SAW filter 40 and the exact time for the blanker switch 46 to reach maximum attenuation may vary by a small amount. However, when dealing with waveforms that are being measured in the microsecond and nanosecond time frames even a small time deviation may adversely affect the operation of the receiver. Accordingly, the duration of the pulse generated by the pulse shaper 76 may be set to an appropriate duration to allow the blanker switch 46 to reach full attenuation and remain "open" until the noise signal has sufficient time to pass through the SAW filter 40 taking into account the varying parameters. Thus, in conjunction with the above example, a pulse duration of approximately 8 microseconds would be acceptable to sufficiently blank the noise signal in the main receiver 26 without substantially impairing the quality of the received signal.

As previously mentioned, the amplifier 64, and thus the Extender 28, is controlled by an AGC signal. Generally, an AGC signal is commonly used in AM receivers as a control for the various amplifiers in the first and second IF sections. Accordingly, the main receiver 26 includes an AGC amplifier and detector 78 to develop the AGC signal. The AGC signal output from the AGC amplifier and detector 78 is generally a DC voltage which varies proportionately to the signal strength of the received signal coupled from the second IF section 50. The AGC signal is applied to a summer 80 which accepts as a second input either of two fixed voltages at input port 82. The sum of these two DC voltages is then applied to the AGC port 68 of the amplifier 64 to control the gain in the well known AGC operation.

The selection of the two fixed voltages applied to the input port 82 of the summer 80 is determined by a switch 84 which in turn is controlled by the control input 86. The two fixed voltage sources correspond to an appropriate voltage to turn the extender 28 either on or off. The control signal applied to the input 86 is generally a logic signal which may be generated by combinational logic gates, a microprocessor or other suitable equivalent. Thus, the mobile receiver may either be supplied with a manually operated switch (so that the operator may enable or disable the Extender), or alternately, may be controlled by a microprocessor or other such supervisory system to determine when to enable the operation of the Extender 28. Some Extender designers would not incorporate this disabling feature in their designs. Accordingly, the summer 80 and the switch 84 could be entirely omitted without affecting the overall operation of the present invention (provided the AGC signal level provided by the AGC amplifier and detector 78 was sufficient to properly control the RF amplifier 64).

Referring now to FIG. 3 the preferred embodiment of the blanker switches 46 (of FIG. 2) is shown in schematic detail. Under normal conditions, the signal from the mixer 42 would proceed through the capacitors 88 and 94 and exit the blanker switch 46 to be processed by the second IF 50 (see FIG. 2). Accordingly, during normal operation, the logic level at control port 48 is at a logic "0" and the FET's 96 and 98 are in their "off" state and do not substantially attenuate the received signal.

In a noise condition the control port 48 rises to a logic "1" state, and the FET 96 is immediately "turned on" and effectively shorts the inductor 90 and the capacitor 91, coupling the receive signal path directly to the capacitor 92 the value of which is selected to provide an AC short at the IF frequency (for example at 10.7 MHz the capacitor value may be 0.01 microfarads). The purpose of the capacitor 88 and 91 and the inductor 90 is to establish a high impedance node to keep the normal (non-noise) operating currents low. This increases the effectiveness of blanker switch 46 since the low currents may be grounded very quickly.

The FET switch 98 is contemporaneously activated with the FET 96 through diode 100 which effectively shorts the resistor 102. The high impedance node for the FET 98 is established by the capacitors 94 and 104 and the inductor 106. These components are selected such that, at the IF frequency, the impedance may be, for example, approximately 3 kilohms which may be effectively shorted by activation of the FET 98. The capacitor 108 may be essentially identical in value to the capacitor 92 and is selected to provide an AC short at the IF frequency.

Typical blanker switches tend to inject noise into the receive signal path through the parasitic capacitance surrounding the FET's thereby substantially defeating the purpose of the blanker switch. To alleviate this problem, the present invention has incorporated the resistors 110 and 112 in series with the gate G of each of the FET's 96 and 98. Taken in conjunction with the surrounding parasitic capacitances, the resistors 110 and 112 form lowpass filters. Accordingly, the values of the resistors 110 and 112 are selected such that, in conjunction with parasitic capacitances, a lowpass filter having an approximate 1 MHz frequency cutoff is established. This substantially attentuates any high frequency noise energy from coupling into the receive signal path.

Another typical blanker switch problem is encountered when the FET's 96 and 98 are "turned off" to resume normal operation. As the FET's 96 and 98 are turning off, noise may coupled into the received signal path which degrades the performance of the blanker switch 46, and thus, the Extender 28. To minimize this problem the present invention has incorporated a resistor 102 and a diode 100 into the control activation line of the FET 98. As previously stated, the rising edge of the logic pulse applied to the control terminal 48 activates the FET 98 immediately since the diode 100 effectively shorts the resistor 102. However, when the logic signal returns to logic "0", the diode 100 is effectively reverse biased and the charge developed on the gate G of FET 98 is discharged through the resistors 112 and 102. Thus, if resistor 102 is selected to provide a sufficiently longer discharge time (for example, by selecting a value of 100 K ohms), the FET 96 will turn off prior to the FET 98. This effectively divides the noise injected due to the FET turn-off in half since any noise injected by the FET 96 will be shunted to AC ground through the FET 98. Thus, the blanker switch 46 of the present invention minimizes the detrimental effects of typical blanker switches while providing significant noise attenuation. Accordingly, although many designs are possible, the blanker switch 46 described above is preferred since it can provide approximately 60 db of attenuation while injecting a negligible amount of noise into the receive signal path due to its own circuitry.

Figure 4:
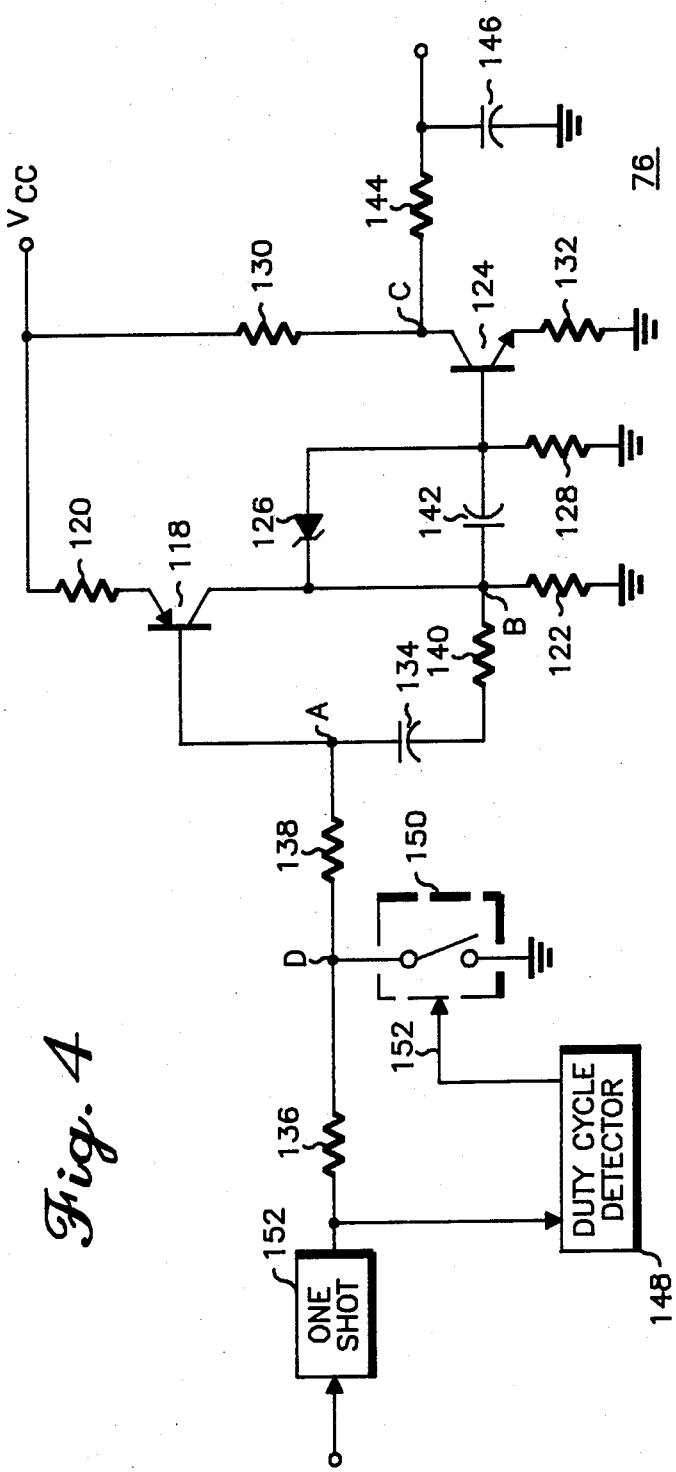
FIG. 4 is a schematic diagram of the pulse shaper of FIG. 2 which controls the blanker switches of FIG. 3.

Referring now to FIG. 4, the pulse shaper 76 of the Extender receiver 28 is depicted in semiblock, semischematic form. To further suppress the detrimental effects of blanker switch noise coupling into the received signal path, the present invention shapes the blanker switch control pulse which is applied to terminal 48 of the blanker switch 46. Those skilled in the art will appreciate that sharp rising and falling edges typically associated with control pulses contain significant high frequency energy. This high frequency energy may easily be coupled, via parasitic capacitance, into the receive signal path. To suppress this effect, the present invention shapes the control pulse into a substantially trapezoidal shape. The sloped rising and falling edges of the control pulse of the present invention contains less high frequency energy, and thus, less high frequency energy is coupled into the receive signal path.

In its quiescent state, the transistor 118 is biased through resistors 120, 122, 136 and 138 to provide a collector voltage of approximately 40% of the $V_{cc}$. The base of the transistor 124 is biased through the Zener diode 126 and resistor 128, while the collector circuitry is biased through the resistors 130 and 132 to have a collector voltage of approximately 20% of $V_{cc}$. For example, if $V_{cc}$ was 9.6 volts then the collector voltage of the transistor 118 may be 4 volts and the collector of transistor 130 may be 2 volts.

Assuming now that the Extender 28 has received a noise signal and the pulse detector 72 and the pulse amplifier 74 (see FIG. 2) have provided a "trigger" pulse the pulse shaper 76, the operation of the pulse shaper 76 can be described. Initially, a substantially rectangular pulse having a predetermined duration is generated by a retriggerable one-shot 152. The capacitor 134 begins to change by the time constant established by the capacitor 134 in conjunction with the resistors 136, 138, 140, and 122. The "integrating" effect of these components changes the substantially rectangular waveform into a substantially triangular waveform at node A of the pulse shaper 76. The rising voltage at node A causes the transistor 118 to conduct less, and accordingly, an inverted substantially triangular waveform appears at node B (the waveform would be inverted since the transistor 118 would be first less conductive and then more conductive in response to the rising and falling triangular waveform at node A). The inverted triangular waveform at node B is rapidly communicated to the transistor 124 through the capacitor 142 causing the transistor 142 to be less conductive, until finally, the transistor 142 is cut-off. Accordingly, the collector of the transistor 124 (which provides the output pulse) correspondingly rises in a substantially triangular ramp shape until the transistor 124 is fully cut off at which point the voltage will essentially be at $V_{cc}$ since no current is conducted when the transistor 124 is cutoff. As the base voltage of the transistor 124 is increased (during the rising portion of the inverted triangular waveform at node B) the transistor 124 again conducts and the output voltage is reduced back to its quiescent voltage. This results in a substantially trapezoidal output waveform having a sloped rising and falling edge and a truncated top voltage portion corresponding to $V_{cc}$. The output trapezoidal pulse is filtered through the resistor 144 and the capacitor 146 which are arranged to form a lowpass filter having approximately a 1 MHz cut-off frequency to attenuate any high frequency noise components that may be present in the control pulse without substantially affecting the predominant pulse shaping.

As previously described the bandpass filter 60 of the Extender 28 is tuneable to any portion of the operating bandwidth of the mobile radio. Accordingly, it is possible to tune the Extender to a portion of the frequency spectrum being used by other radios, or to have other radios, subsequently occupy the bandwidth selected for the Extender 28. In either case, whenever other carriers or information signals are present, the Extender 28 may interpret these signals as noise and continually blank the main receiver 26. To guard against this condition, the pulse shaper 76 of the present invention includes a duty cycle detector 148 whose purpose is to monitor the frequency of the pulses being generated by the one-shot 152. Should the pulses occur so often such that a predetermined threshold of the duty cycle is exceeded, the duty cycle detector 148 will close the switch 150 and effectively ground node D thereby inactivating the pulse shaper 76. For example, the duty cycle detector 48 may be set such that whenever the pulses from the one-shot 152 appear with such regularity that they form a 90% duty cycle, duty cycle detector 148 will assert its control pulse to the control input 152 of the switch 150 preventing the pulse shaper 76 from functioning.

While only particular embodiments of the present invention have been shown and described herein, it will be obvious that certain modifications may be made without departing from the invention in its broader aspects, and accordingly, the appended claims are intended to cover any and all such changes and alternative variations that fall within the true scope and spirit of the invention.

What is claimed is:

1. A wideband mobile receiver apparatus for recovering an information signal from a received signal, which includes means for blanking noise signals which may otherwise deteriorate performance, comprising in combination:
   means for splitting the received signal into first and second input signals;
   receiver means for recovering the information signal comprising:
      first conversion means for operating on said first input signal to provide a first intermediate signal;
      SAW filter means for filtering and delaying said first intermediate signal to provide a second intermediate signal;
      second conversion means coupled to a range extender means and including at least one blanker switch means for operating on said second intermediate signal to temporarily prevent recovery of the information signal in response to a control signal, and for providing an AGC signal, and
   said range extender means coupled to said receiver means, for operating on said second input signal to provide said control signal in response to said AGC signal.

2. A wideband mobile receiver apparatus for recovering an information signal from a received signal, which includes means for blanking noise signals which may otherwise deteriorate performance, comprising in combination:
   means for splitting the received signal into first and second input signals;
   receiver means, including at least one conversion means and SAW filter means, for recovering the information signal from said first input signal, and for providing an AGC signal, said receiver means further including at least one blanker switch means for temporarily preventing recovery of the information signal in response to a control signal; and
   range extender means comprising:
      filtering means for filtering said second input signal to provide a filtered signal;
      amplifier means for amplifying said filtered signal in response to said AGC signal to provide an amplified signal; and
      means for generating said control signal from said amplified signal.

3. A wideband mobile receiver apparatus for recovering an information signal from a received signal, which includes means for blanking out noise signals which may otherwise deteriorate performance, comprising in combination:
   means for splitting the received signal into first and second input signals;
   receiver means comprising:
      first conversion means for operating on said first input signal to provide a first intermediate signal;
      SAW filter means for filtering and delaying said first intermediate signal to provide a second intermediate signal;
      second conversion means, coupled to a range extender means and including at least one blanker switch means, for operating on operating on said second intermediate signal to recover the information signal in response to a control signal, and for providing an AGC signal; and
   said range extender means comprising:
      means for filtering said second input signal to provide a filtered signal;
      means for amplifying said filtered signal in response to said AGC signal to provide an amplified signal; and
      means for generating said control signal from said amplified signal.

4. The mobile receiver of claim 1, 2 or 3 wherein said SAW filter means comprises a SAW filter having a bandpass filter characteristic.

5. The mobile receiver of claim 1 or 3, wherein said first conversion means comprises:
   means for generating an injection signal;
   first filtering means for receiving said first input signal to provide a filtered input signal;
   mixing means coupled to said filter means and said generating means for providing a mixed output signal;
   processing means including amplification means and second filtering means, for operating on said mixed output signal to provide an intermediate frequency signal.

6. The mobile receiver of claim 1 or 3, wherein said second conversion means comprises:
   means for generating an injection signal;
   mixing means coupled to said SAW filter means and said generating means for mixing said second intermediate frequency signal and said injection signal to provide a mixed output signal;
   said blanker switch means, coupled to said mixing means momentarily inhibiting the transmission of said second intermediate frequency signal in response to a control signal;
   processing means, including amplification and filtering means, for processing said mixed output signal providing a processed output signal;

AGC means, coupled to said processing means for providing an AGC signal in response to a characteristic of said processing means;

audio recovery means coupled to said processing means for recovering the information signal from said processed output signal.

7. The mobile receiver of claim 6, wherein said blanker switch means comprises at least one field-effect transistor constructed and arranged to shunt said mixed output signal to AC ground.

8. The mobile receiver of claim 6, wherein said blanker switch means comprises:

first and second impedance means for establishing a sufficiently high impedance such that any current flowing through said first and second impedance means is limited to an appropriate magnitude;

first and second FET's each having a gate, source and drain port and an appropriate resistance serially connected to said gate port to reduce noise coupling, said first and second FET's constructed and arranged to be respectively coupled to said first and second impedance means such that said first and second FET's effectively short said first and second impedance means when activated; and activation means coupled to said resistance serially connected to each of said FET's for contemporaneously activating said first and second FET's and deactivating said first FET prior to said second FET.

9. The mobile receiver of claim 2 or 3, wherein said filtering means comprises a bandpass filter.

10. The mobile receiver of claim 9, wherein said bandpass filtering means comprises a 3-pole tunable bandpass filter.

11. The mobile receiver of claim 2 or 3, wherein said control signal generating means further comprises:

filtering means for receiving said amplified signal and providing a filtered output signal;

pulse detector means for operating on said filtered output signal to provide an output pulse whenever the noise contents of said filtered signal exceeds a predetermined threshold;

pulse amplifier means for amplifying said output pulse for providing a trigger pulse; and pulse shaper means for receiving said trigger pulse and for providing a substantially trapezoidal output pulse.

12. The mobile receiver of claim 11, wherein pulse shaper means comprises:

means for generating a substantially rectangular pulse having a predetermined duration;

means for integrating said substantially rectangular pulse to provide a substantially triangular pulse; and means for truncating said substantially triangular pulse to provide a substantially trapezoidal pulse.

13. The mobile receiver of claim 12, wherein said pulse shaper further comprises:

means for monitoring said generating means to provide a control signal whenever the duty cycle of said substantially rectangular pulses exceed a predetermined threshold; and switch means coupled to said monitoring means and said integrating means for inhibiting said pulse shaper in response to said control signal.

14. In a wideband mobile receiver, which includes means for blanking noise signals which may otherwise deteriorate performance, a method for temporarily preventing recovery of an information signal in a received signal comprising the steps of:

(a) splitting the received signal into first and second input signals;

(b) converting first input signal to provide a first intermediate signal;

(c) filtering and delaying said first intermediate signal in a SAW filter means to provide a second intermediate signal;

(d) converting said second intermediated signal into a recovered signal and providing an AGC signal;

(e) preventing, temporarily, said conversion of said second intermediate signal into a recovered signal in response to a control signal;

(f) operating on said second input signal to provide said control signal in response to said AGC signal.

15. In a wideband mobile receiver, which includes means for blanking noise signals which may otherwise deteriorate performance, a method for temporarily preventing recovery of an information signal in a received signal comprising the steps of:

(a) splitting the received signal into first and second input signals;

(b) recovering the information signal from said first input signal in a receiver means, including at least one conversion means and SAW filter means, and providing an AGC signal;

(c) preventing, temporarily, recovery of the information signal in response to a control signal;

(d) filtering said second input signal to provide a filtered signal;

(e) amplifying said filtered signal in response to said AGC signal to provide an amplified signal;

(f) generating said control signal from said amplified signal.

* * * * *